(12) United States Patent
Cheng et al.

(10) Patent No.: US 11,270,935 B2
(45) Date of Patent: Mar. 8, 2022

(54) METALLIZATION LAYER FORMATION PROCESS

(71) Applicant: INTERNATIONAL BUSINESS MACHINES CORPORATION, Armonk, NY (US)

(72) Inventors: Kangguo Cheng, Schenectady, NY (US); Ruilong Xie, Niskayuna, NY (US); Chih-Chao Yang, Glenmont, NY (US); Jing Guo, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 90 days.

(21) Appl. No.: 16/515,926

(22) Filed: Jul. 18, 2019

(65) Prior Publication Data

US 2021/0020565 A1    Jan. 21, 2021

(51) Int. Cl.
*H01L 23/522* (2006.01)
*H01L 21/768* (2006.01)

(52) U.S. Cl.
CPC .... *H01L 23/5226* (2013.01); *H01L 21/76816* (2013.01); *H01L 21/76877* (2013.01); *H01L 21/76897* (2013.01)

(58) Field of Classification Search
CPC ........... H01L 23/5226; H01L 21/76877; H01L 21/76816; H01L 21/76897; H01L 21/76808
See application file for complete search history.

(56) References Cited

U.S. PATENT DOCUMENTS

| 5,262,353 A | * | 11/1993 | Sun ..................... H01L 23/5225 257/503 |
|---|---|---|---|
| 9,362,165 B1 | | 6/2016 | Bouche et al. |
| 9,478,462 B1 | | 10/2016 | Wang et al. |
| 9,735,029 B1 | | 8/2017 | Chu et al. |
| 9,793,164 B2 | | 10/2017 | Machkaoutsan et al. |
| 2013/0069234 A1 | * | 3/2013 | Lee ................... H01L 23/53238 257/751 |

(Continued)

OTHER PUBLICATIONS

Liu et al., "DSA Patterning Options for Logics and Memory Applications", Advances in Patterning Materials and Processes XXXIV, Proc. of SPIE Mar. 2017, 13 pages vol. 10146, 101460.

*Primary Examiner* — Benjamin Tzu-Hung Liu
(74) *Attorney, Agent, or Firm* — Tutunjian & Bitetto, P.C.; L. Jeffrey Kelly

(57) ABSTRACT

A method of forming cut conductive lines is provided. The method includes forming a trough in a dielectric cover layer over a plurality of electrical contacts. The method further includes filling the trough with a planarization layer, and forming a plurality of vias in the planarization layer and the dielectric cover layer, wherein each of the plurality of vias is aligned with one of the plurality of electrical contacts. The method further includes removing the planarization layer, and forming a sacrificial via plug in each of the plurality of vias in the dielectric cover layer. The method further includes forming a fill layer in the trough, and forming a planarization layer opening through the fill layer, wherein the planarization layer opening is positioned between two adjacent sacrificial via plugs. The method further includes forming a separator in the planarization layer opening.

18 Claims, 9 Drawing Sheets

(56) References Cited

U.S. PATENT DOCUMENTS

| | | |
|---|---|---|
| 2016/0056104 A1 | 2/2016 | Bouche et al. |
| 2016/0204002 A1 | 7/2016 | Wallace et al. |
| 2017/0140986 A1 | 5/2017 | Machkaoutsan et al. |
| 2018/0096932 A1 | 4/2018 | Xie et al. |
| 2018/0269305 A1 | 9/2018 | Bao et al. |
| 2018/0294225 A1* | 10/2018 | Lee .................. H01L 27/11565 |
| 2020/0066629 A1* | 2/2020 | Schenker ............ H01L 27/0886 |
| 2020/0312764 A1* | 10/2020 | Ning ................ H01L 21/76801 |

* cited by examiner

METALLIZATION LAYER FORMATION PROCESS

BACKGROUND

The present invention generally relates to back-end-of-line metallization processes, and more particularly to metal line cuts.

SUMMARY

In accordance with an embodiment of the present invention, a method of forming cut conductive lines is provided. The method includes forming a trough in a dielectric cover layer over a plurality of electrical contacts. The method further includes filling the trough with a planarization layer, and forming a plurality of vias in the planarization layer and the dielectric cover layer, wherein each of the plurality of vias is aligned with one of the plurality of electrical contacts. The method further includes removing the planarization layer, and forming a sacrificial via plug in each of the plurality of vias in the dielectric cover layer. The method further includes forming a fill layer in the trough, and forming a planarization layer opening through the fill layer, wherein the planarization layer opening is positioned between two adjacent sacrificial via plugs. The method further includes forming a separator in the planarization layer opening.

In accordance with another embodiment of the present invention, a method of forming cut conductive lines is provided. The method includes forming a plurality of vias in a planarization layer and a dielectric cover layer, wherein each of the plurality of vias is aligned with one of a plurality of electrical contacts beneath the dielectric cover layer. The method further includes removing the planarization layer, and forming a sacrificial via plug in each of the plurality of vias in the dielectric cover layer. The method further includes forming a fill layer in the trough, and forming a planarization layer opening through the fill layer, wherein the planarization layer opening is positioned between two adjacent sacrificial via plugs. The method further includes forming an electrically insulating separator in the planarization layer opening, wherein the separator includes a separator projection extending below the top surface of the dielectric cover layer, and removing the fill layer.

In accordance with yet another embodiment of the present invention, a set of cut conductive lines is provided. The set of cut conductive lines includes a plurality of electrical devices on a substrate. The set of cut conductive lines further includes a device interlayer dielectric (ILD) layer on the plurality of electrical devices and substrate, and an electrical contact to each of the plurality of electrical devices. The set of cut conductive lines further includes a dielectric cover layer on the device ILD layer, and a plurality of vias in the dielectric cover layer, wherein each of the vias is aligned with one of the electrical contacts. The set of cut conductive lines further includes a separator between two adjacent vias of the plurality of vias, wherein the separator includes a separator projection extending below the top surface of the dielectric cover layer into one of the two adjacent vias, and a conductive layer on the dielectric cover layer that fills in the plurality of vias. These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide metal line cuts in the back-end-of-line metallization processes that are positioned relative to metallization contact vias, rather than the metallization contact vias be aligned to the metal line cuts. Reversing the process by forming the vias and using a sacrificial via plug to maintain the via size during subsequent processes can avoid the formation of undersized or pinched-off vias and electrical connections.

Embodiments of the present invention provide a metallization layer with improved electrical contacts to underlying devices and/or electrical connections by positioning separators between vias after the vias have been formed. The vias can thereby be self-aligned with the devices.

Exemplary applications/uses to which the present invention can be applied include, but are not limited to: logic devices and memory devices.

It is to be understood that aspects of the present invention will be described in terms of a given illustrative architecture; however, other architectures, structures, substrate materials and process features and steps can be varied within the scope of aspects of the present invention.

Figure 1:
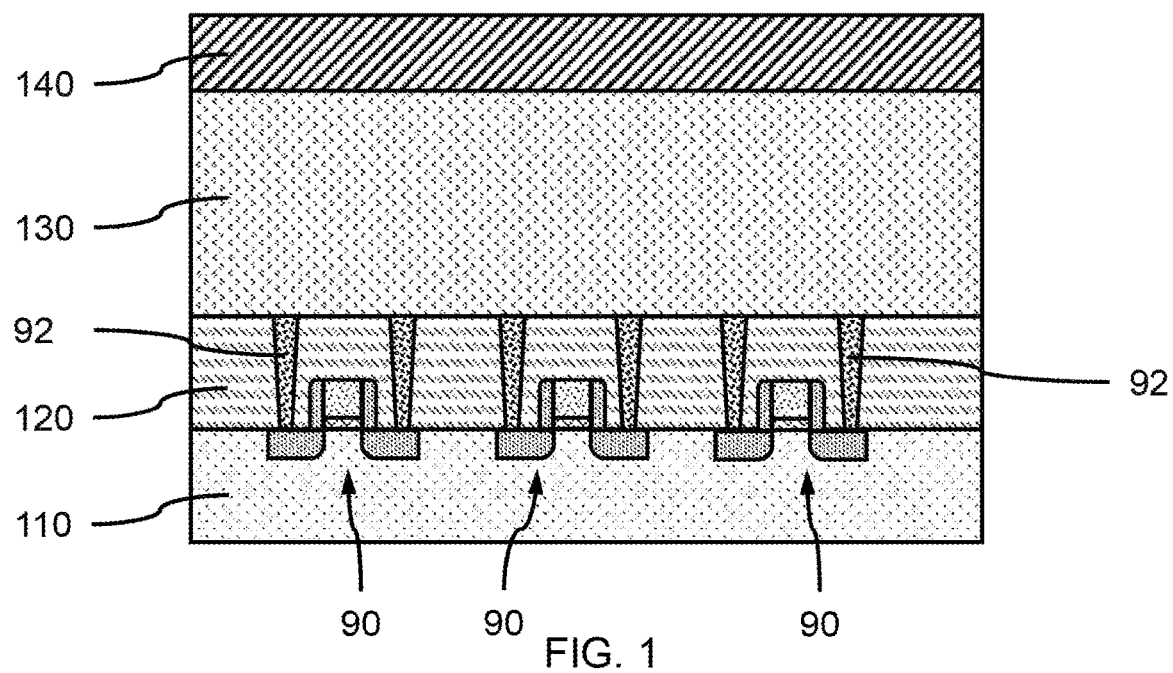
FIG. 1 is a cross-sectional side view showing a plurality of devices covered by a device interlayer dielectric (ILD) layer on a substrate, and a dielectric cover layer on the device ILD layer, in accordance with an embodiment of the present invention.

Referring now to the drawings in which like numerals represent the same or similar elements and initially to FIG. 1, a cross-sectional side view of a plurality of devices covered by a device interlayer dielectric (ILD) layer on a substrate and a dielectric cover layer on the device ILD layer is shown, in accordance with an embodiment of the present invention.

In one or more embodiments, one or more electrical devices 90 can be fabricated on a substrate 110. The one or more electrical devices 90 can be active devices, for example, fin field effect transistor (FinFET) devices or metal-oxide-semiconductor field effect transistor (MOSFET) devices, passive devices, for example, capacitors, resistors, or inductors, or underlying metal lines and/or interconnects. Each of the electrical devices 90 can have one or more electrical contact(s) 92, where the electrical contact(s) 92 can provide an electrical path to, for example, a source/drain, a gate structure, or a device terminal (e.g., capacitor terminal, resistor terminal, etc.).

In one or more embodiments, the substrate 110 can be a semiconductor wafer or a semiconductor-on-insulator (SeOI), for example, silicon-on-insulator (SOI) or silicon-germanium-on-insulator (SGOI). In various embodiments, the substrate 110 can be a type IV semiconductor, for example, silicon (Si) or germanium (Ge), a IV-IV semiconductor, for example, silicon-germanium (SiGe) or silicon carbide (SiC), or a type III-V semiconductor, for example, gallium arsenide (GaAs) or indium phosphide (InP). In various embodiments, the substrate 110 can be a single crystal semiconductor wafer.

In one or more embodiments, the electrical devices 90 can be in and covered by a device interlayer dielectric (ILD) layer 120, where the device ILD layer 120 can electrically insulate and physically separate the electrical devices 90 and electrical contact(s) 92. The electrical contact(s) 92 can be formed in or through the device ILD layer 120 to the electrical devices 90.

In various embodiments, the device interlayer dielectric layer 120 can be an insulating, dielectric material, including, but not limited to, silicon oxide (SiO), silicon nitride (SiN), silicon oxynitride (SiON), silicon boro carbonitride (SiBCN), a low-k dielectric material, and combinations thereof. A low-k dielectric material can be, for example, fluorine doped silicon oxide (SiO:F), carbon doped silicon oxide (SiO:C), hydrogen silsesquioxane (HSQ), methylsilsesquioxane (MSQ), tetraethoxysilane (TEOS), and combinations thereof.

In various embodiments, the electrical contact(s) 92 can be a suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotube, conductive carbon, graphene, or any suitable combination of these materials.

In one or more embodiments, a dielectric cover layer 130 can be formed on the device ILD layer 120, electrical devices 90, and electrical contacts 92. The dielectric cover layer 130 can be formed by a blanket deposition, for example, chemical vapor deposition (CVD), plasma enhanced CVD (PECVD), physical vapor deposition (PVD), or a spin-on process, that covers the surface of the underlying device ILD layer 120.

In various embodiments, the dielectric cover layer 130 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material (e.g., hydrogenated silicon oxycarbide also referred to as organosilicate glass (SiCOH), fluorinated silicon glass (FSG or SiOF)), an ultra-low-k (ULK) dielectric material (e.g., porous hydrogenated silicon oxycarbide (pSiCOH)), or a combination thereof.

In various embodiments, the dielectric cover layer 130 can have a thickness in a range of about 30 nanometers (nm) to about 120 nm, or about 40 nm to about 80 nm, or about 50 nm to about 60 nm, although other thicknesses are also contemplated.

In one or more embodiments, a mask layer 140 can be formed on the dielectric cover layer 130, where the mask layer 140 can be a hardmask, a softmask, or a combination of a hardmask and softmask. The mask layer 140 can be formed on the dielectric cover layer 130 by a blanket deposition. In various embodiments, the hardmask can be a dielectric material, and the softmask can be a polymer or resist material. The mask layer 140 can be patterned and developed using lithographic processes and/or etching.

Figure 2:
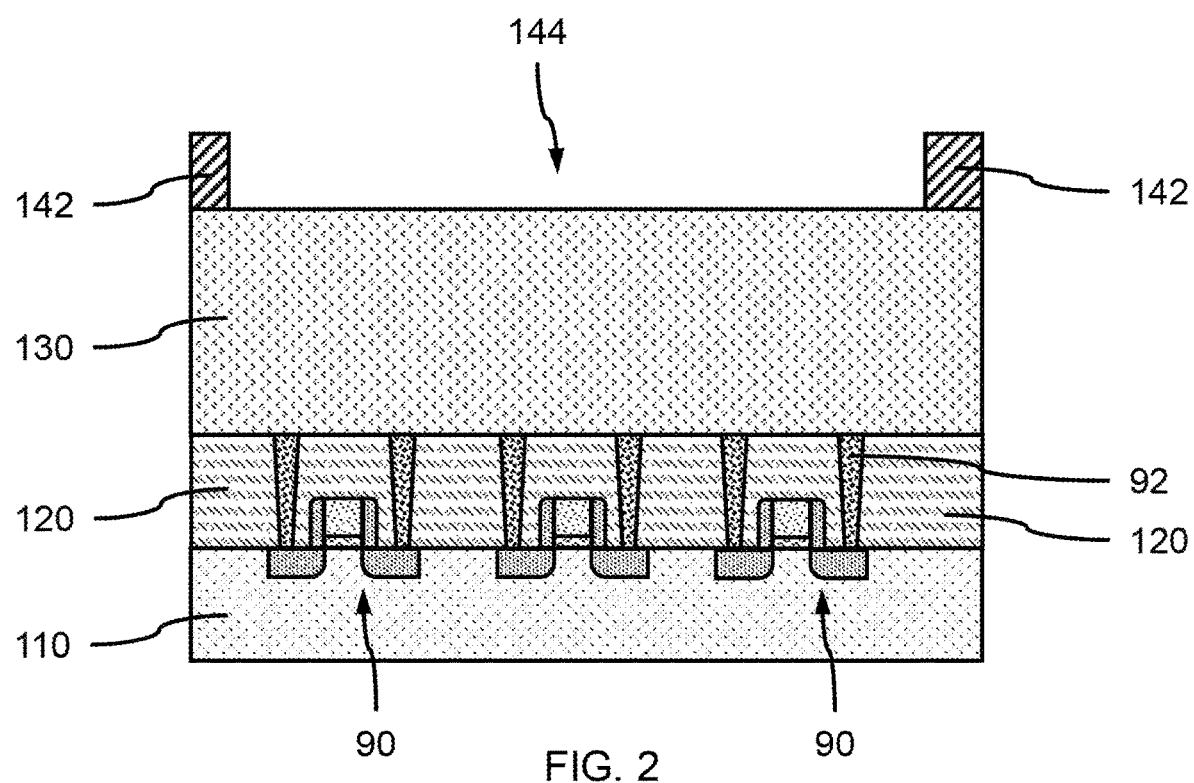
FIG. 2 is a cross-sectional side view showing a mask layer with an opening on the dielectric cover layer, in accordance with an embodiment of the present invention.

FIG. 2 is a cross-sectional side view showing a mask layer with an opening on the dielectric cover layer, in accordance with an embodiment of the present invention.

In one or more embodiments, an mask opening 144 can be formed in the mask layer 140 using lithographic processes and etching to expose an underlying portion of the dielectric cover layer 130. The mask opening 144 can be over one or more of the electrical devices 90 and electrical contacts 92. Masking blocks 142 can remain on portions of the dielectric cover layer 130.

Figure 3:
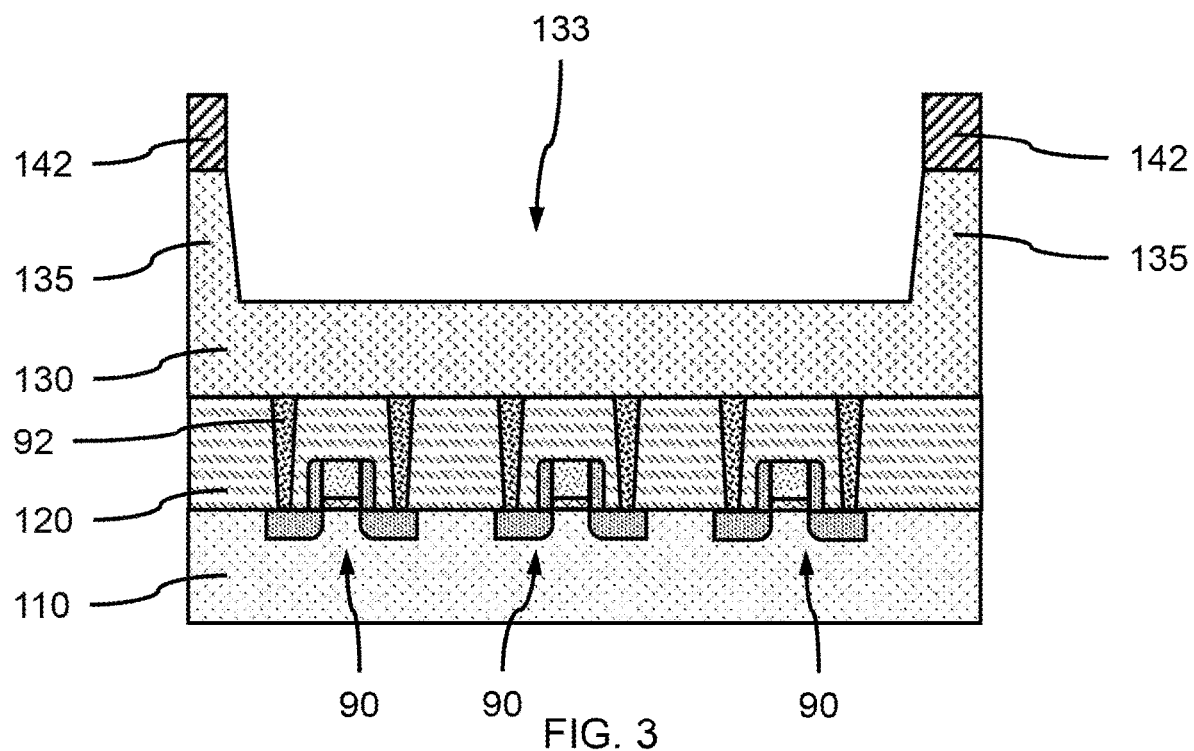
FIG. 3 is a cross-sectional side view showing a trough formed in the dielectric cover layer, in accordance with an embodiment of the present invention.

FIG. 3 is a cross-sectional side view showing a trough formed in the dielectric cover layer, in accordance with an embodiment of the present invention.

In one or more embodiments, a portion of the dielectric cover layer 130 exposed by the mask opening 144 can be removed using a selective directional etch, for example, a reactive ion etch (RIE) to form a trough 133 in the dielectric cover layer 130, where unremoved portions of the dielectric cover layer 130 can form cover layer sidewalls 135 of the trough 133. A lower portion of the dielectric cover layer 130 can form a bottom surface of the trough 133 and the cover layer sidewalls 135 can form the interior sidewall surfaces of the trough 133. Masking blocks 142 can remain on the cover layer sidewalls 135.

In various embodiments, the trough 133 can have a depth from the top surface of the dielectric cover layer 130 in a range of about 15 nanometers (nm) to about 70 nm, or about 20 nm to about 40 nm, although other depths are also contemplated.

In various embodiments, the dielectric cover layer 130 can have a remaining thickness between the bottom surface of the trough 133 and the top surface of the device interlayer dielectric (ILD) layer 120 in a range of about 15 nanometers (nm) to about 70 nm, or about 20 nm to about 40 nm, although other depths are also contemplated.

Figure 4:
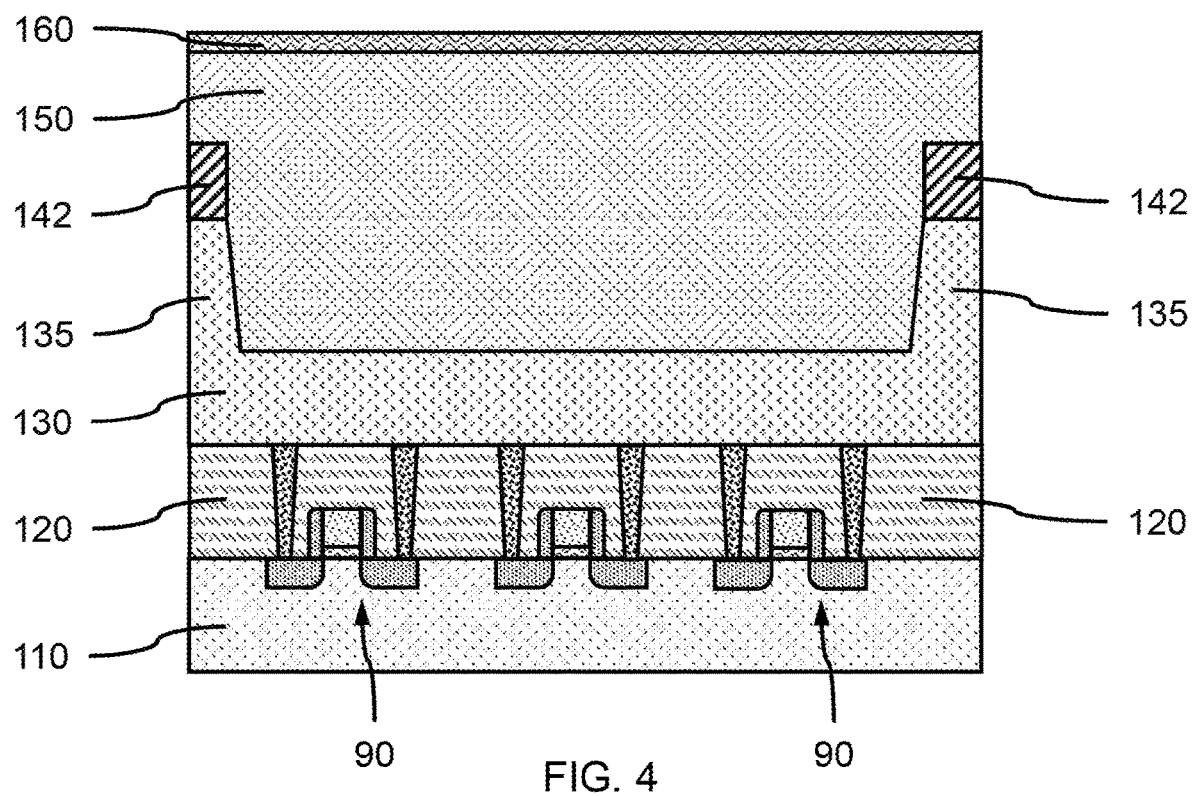
FIG. 4 is a cross-sectional side view showing a planarization layer formed in the trough in the dielectric cover layer, and a capping layer formed on the planarization layer, in accordance with an embodiment of the present invention.

FIG. 4 is a cross-sectional side view showing a planarization layer formed in the trough in the dielectric cover layer, and a capping layer formed on the planarization layer, in accordance with an embodiment of the present invention.

In one or more embodiments, a planarization layer 150 can be formed in the trough 133 in the dielectric cover layer 130, where the planarization layer 150 can be formed by a blanket deposition (e.g., CVD, PECVD, spin-on). The planarization layer 150 can extend above and cover the top surfaces of the masking blocks 142.

In various embodiments, the planarization layer 150 can be an insulating, dielectric material, including, but not limited to, silicon oxide (SiO), silicon nitride (SiN), silicon oxynitride (SiON), silicon boro carbonitride (SiBCN), a low-k dielectric material, and combinations thereof. A low-k dielectric material can be, for example, fluorine doped silicon oxide (SiO:F), carbon doped silicon oxide (SiO:C), hydrogen silsesquioxane (HSQ), methylsilsesquioxane (MSQ), tetraethoxysilane (TEOS), and combinations thereof. In various embodiments, the planarization layer 150 can be a developable organic planarization layer (OPL), which can be an organic polymer, including, but not limited to, polyacrylate resin, epoxy resin, phenol resin, polyamide resin, polyimide resin, unsaturated polyester resin, polyphenylenether resin, polyphenylenesulfide resin, or a combination thereof.

In one or more embodiments, a capping layer 160 can be formed on the planarization layer 150, where the capping layer 160 can be formed by a blanket deposition (e.g., CVD, PECVD), a conformal deposition, for example, atomic layer deposition (ALD) or plasma enhanced ALD (PEALD), or a combination thereof.

In various embodiments, the capping layer 160 can be an anti-reflective coating (ARC), which can be a silicon-containing anti-reflection coating (SiARC), for example, silsesquioxane material that may include polyhedral oligomeric silsesquioxane (POSS).

In various embodiments, the capping layer 160 can have a thickness in a range of about 5 nm to about 50 nm, or about 6 nm to about 30 nm, although other thicknesses are also contemplated.

Figure 5:
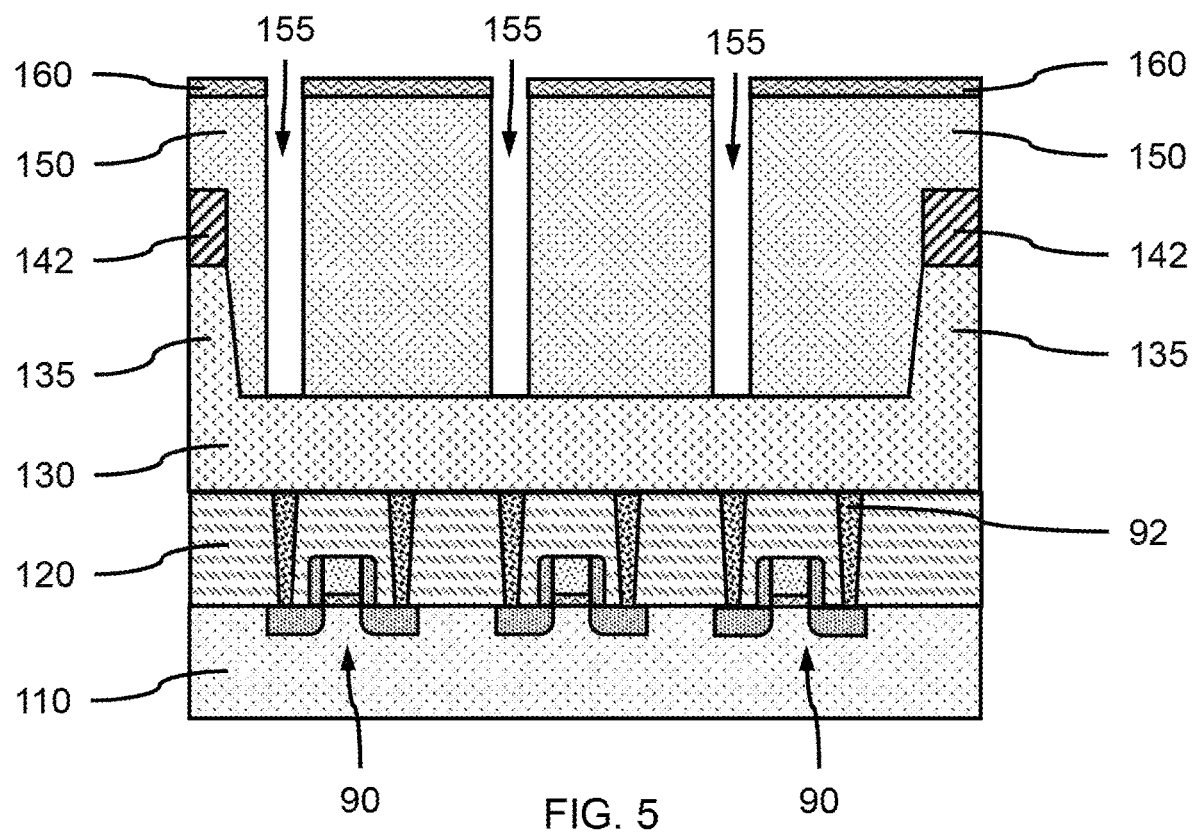
FIG. 5 is a cross-sectional side view showing a plurality of vias formed in the planarization layer and capping layer, where the vias expose portions of the dielectric cover layer, in accordance with an embodiment of the present invention.

FIG. 5 is a cross-sectional side view showing a plurality of vias formed in the planarization layer and capping layer, where the vias expose portions of the dielectric cover layer, in accordance with an embodiment of the present invention.

In one or more embodiments, a plurality of vias 155 can be formed in the capping layer 160 and planarization layer 150, where the vias 155 can expose portions of the dielectric cover layer 130. The vias can be formed using lithographic processes and selective, directional etching (e.g., RIE). In various embodiments, the vias 155 can each be aligned with an electrical contact 92.

Figure 6:
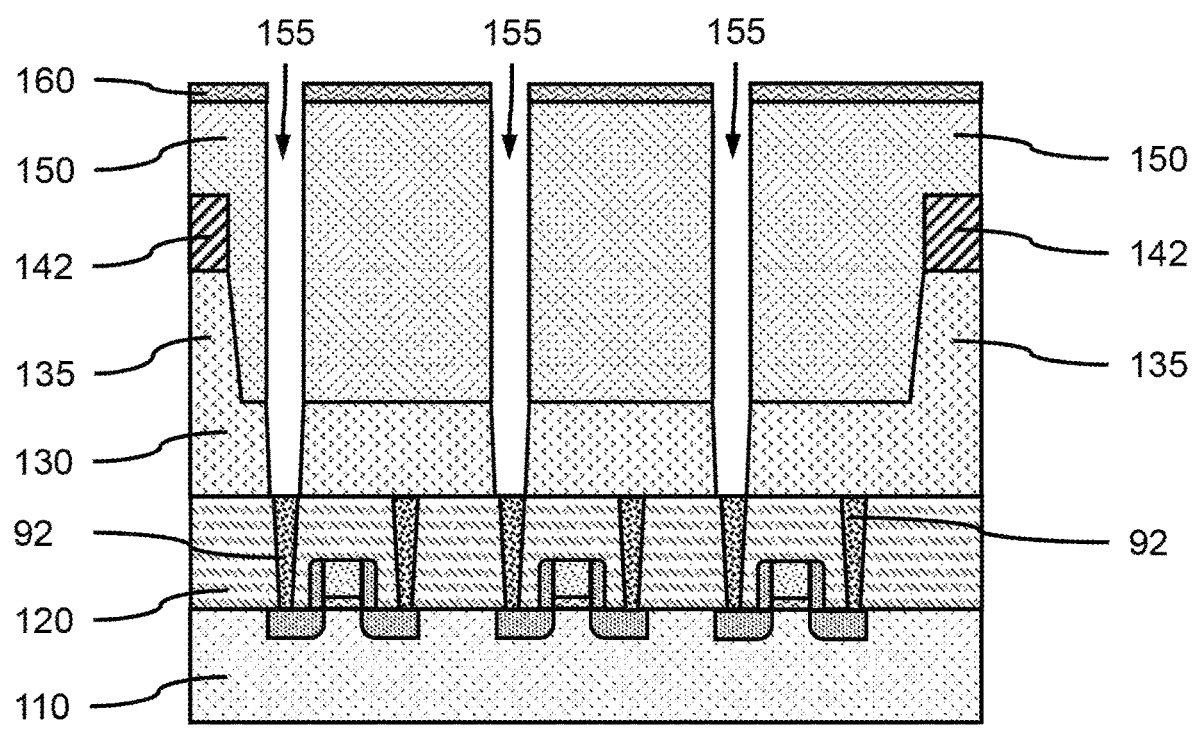
FIG. 6 is a cross-sectional side view showing exposed portions of the dielectric cover layer removed from above device contacts, in accordance with an embodiment of the present invention.

FIG. 6 is a cross-sectional side view showing exposed portions of the dielectric cover layer removed from above device contacts, in accordance with an embodiment of the present invention.

In one or more embodiments, the plurality of vias 155 can be extended into the dielectric cover layer 130 using a selective RIE, where the vias 155 can expose an underlying electrical contact 92. A via 155 may not be perfectly aligned with an electrical contact 92, so there can be overlap or underlap due to the misalignment.

Figure 7:
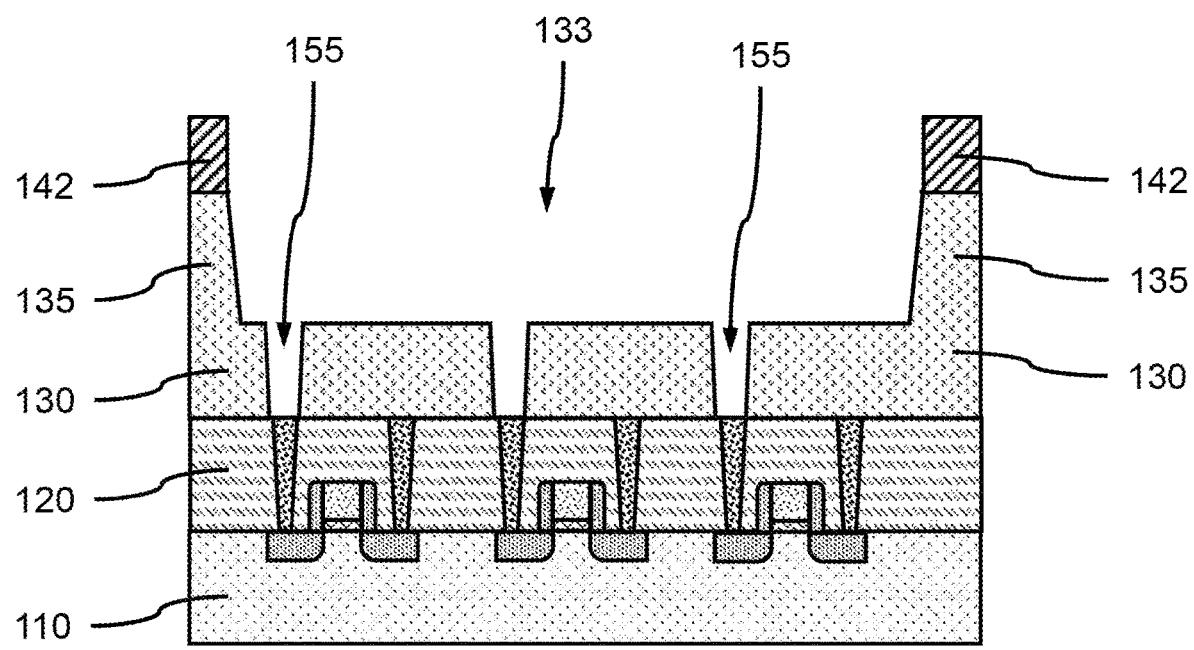
FIG. 7 is a cross-sectional side view showing the remaining portions of the planarization layer and capping layer removed from the dielectric cover layer, in accordance with an embodiment of the present invention.

FIG. 7 is a cross-sectional side view showing the remaining portions of the planarization layer and capping layer removed from the dielectric cover layer, in accordance with an embodiment of the present invention.

In one or more embodiments, the remaining portions of the planarization layer 150 and capping layer 160 can be removed from the dielectric cover layer 130 using isotropic etching, for example, wet chemical etching or dry plasma etching, or ashing. Removal of the planarization layer 150 can expose the bottom surface of the trough 133 and the portions of the vias 155 in the dielectric cover layer 130.

Figure 8:
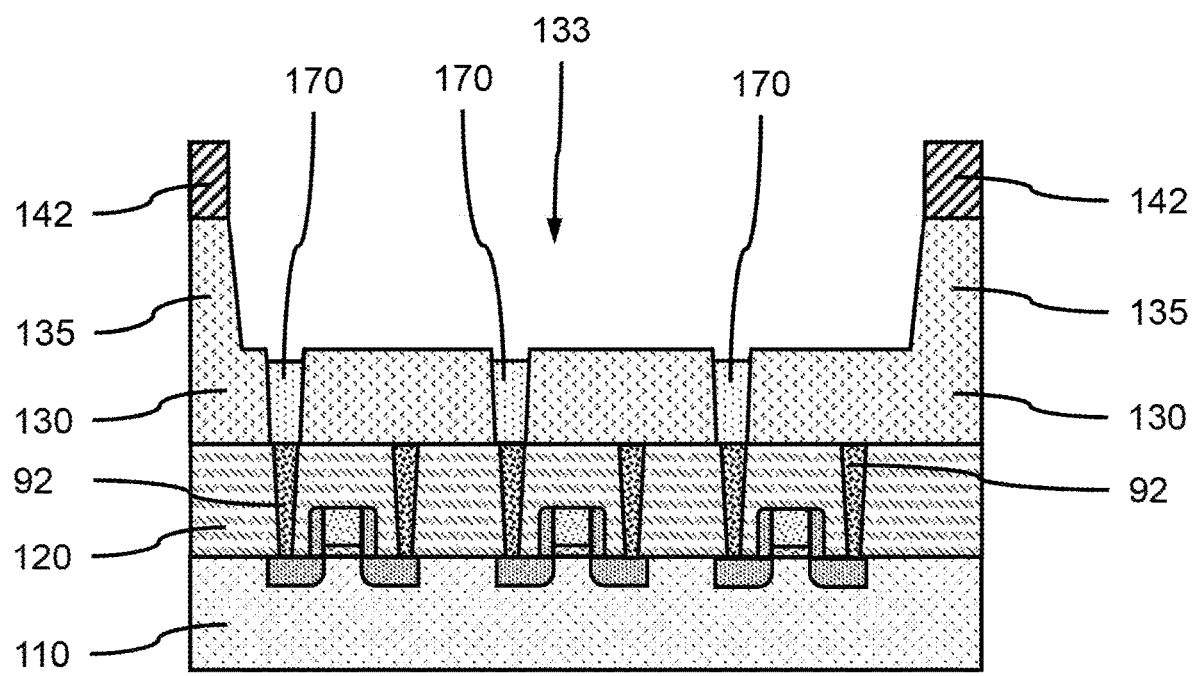
FIG. 8 is a cross-sectional side view showing sacrificial via plugs formed in the vias in the dielectric cover layer, in accordance with an embodiment of the present invention.

FIG. 8 is a cross-sectional side view showing sacrificial via plugs formed in the vias in the dielectric cover layer, in accordance with an embodiment of the present invention.

In one or more embodiments, sacrificial via plugs 170 can be formed in the portions of the vias 155 in the dielectric cover layer 130, where the sacrificial via plugs 170 can be formed by a conformal deposition (e.g., ALD, PEALD), a blanket deposition (e.g., CVD, PECVD), or a combination thereof. The sacrificial via plugs 170 can be formed by filling in at least a portion of the trough 133 and selectively etching back the material forming the sacrificial via plugs 170. The top surfaces of the sacrificial via plugs 170 can be below the bottom surface of the trough 133, such that there is a step between the top surface of the dielectric cover layer 130 at the opening of the vias 155 and the top surfaces of the sacrificial via plugs 170.

In one or more embodiments, the top surfaces of the sacrificial via plugs 170 can be recessed below the bottom surface of the trough 133 by a distance in a range of about 0 nm to about 10 nm, although other distances are also contemplated.

In various embodiments, the sacrificial via plugs 170 can be polycrystalline or amorphous silicon, germanium, silicon-germanium, titanium oxide (TiO), aluminum oxide (AlO), or a combination thereof, where the sacrificial via plugs 170 can be selectively removed from the vias 155.

Figure 9:
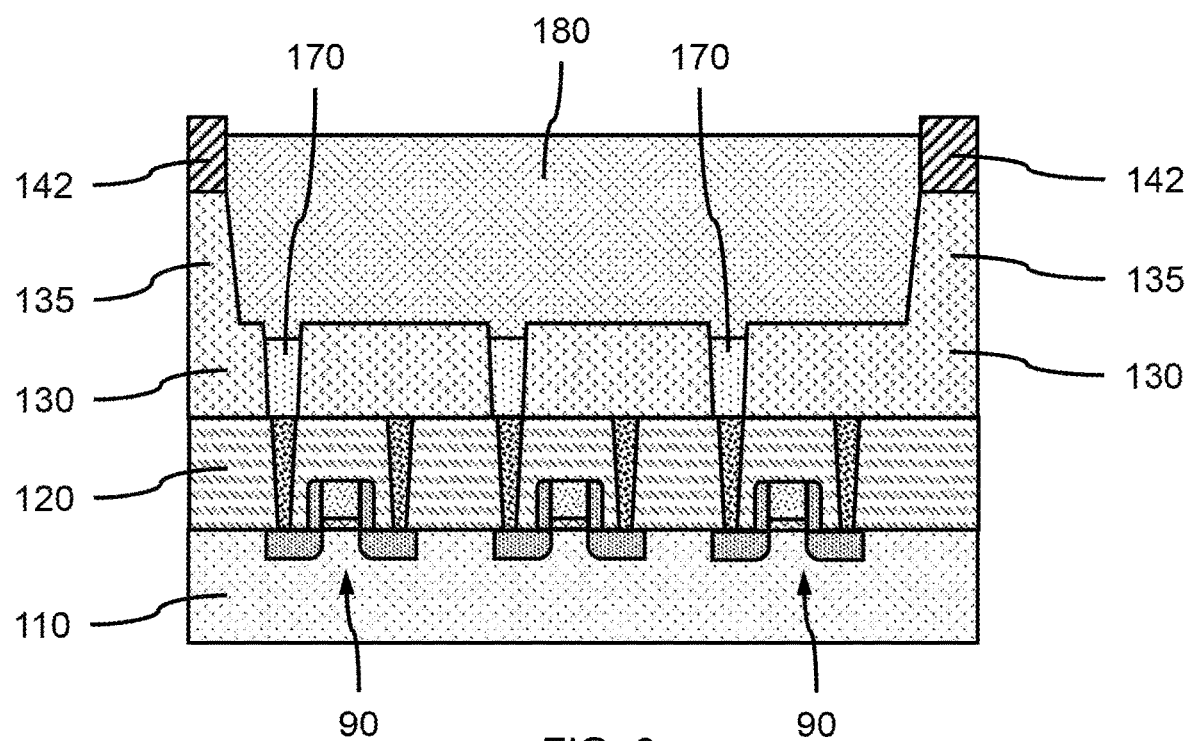
FIG. 9 is a cross-sectional side view showing a fill layer formed in the trough over the sacrificial via plugs and the dielectric cover layer, in accordance with an embodiment of the present invention.

FIG. 9 is a cross-sectional side view showing a fill layer formed in the trough over the sacrificial via plugs and the dielectric cover layer, in accordance with an embodiment of the present invention.

In one or more embodiments, a fill layer 180 can be formed in the trough 133 over the sacrificial via plugs 170 and the dielectric cover layer 130. The fill layer 180 can be formed by a conformal deposition (e.g., ALD, PEALD), a blanket deposition (e.g., CVD, PECVD), or a combination thereof. The fill layer may not entirely fill the trough 133, where the top surface of the fill layer can be below the top surfaces of the masking blocks 142.

In various embodiments, the fill layer 180 can be a developable organic planarization layer (OPL), which can be an organic polymer, including, but not limited to, polyacrylate resin, epoxy resin, phenol resin, polyamide resin, polyimide resin, unsaturated polyester resin, polyphenylenether resin, polyphenylenesulfide resin, or a combination thereof.

Figure 10:
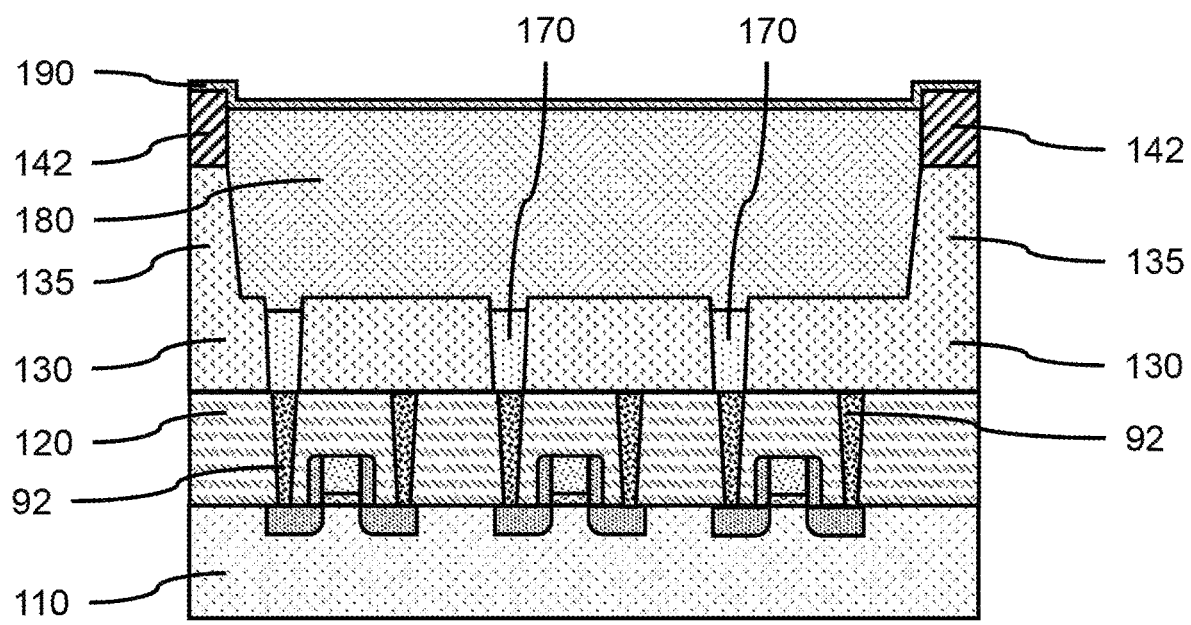
FIG. 10 is a cross-sectional side view showing a second capping layer formed on the fill layer and masking blocks, in accordance with an embodiment of the present invention.

FIG. 10 is a cross-sectional side view showing a second capping layer formed on the fill layer and masking blocks, in accordance with an embodiment of the present invention.

In one or more embodiments, a second capping layer 190 can be formed on the fill layer 180, where the second capping layer 190 can be formed by a blanket deposition (e.g., CVD, PECVD), a conformal deposition, for example, atomic layer deposition (ALD) or plasma enhanced ALD (PEALD), or a combination thereof. The second capping layer 190 can cover the exposed surfaces of the masking blocks 142.

In various embodiments, the second capping layer 190 can be an anti-reflective coating (ARC), which can be a silicon-containing anti-reflection coating (SiARC), for example, silsesquioxane material that may include polyhedral oligomeric silsesquioxane (POSS).

In various embodiments, the second capping layer 190 can have a thickness in a range of about 5 nm to about 50 nm, or about 8 nm to about 30 nm, although other thicknesses are also contemplated.

Figure 11:
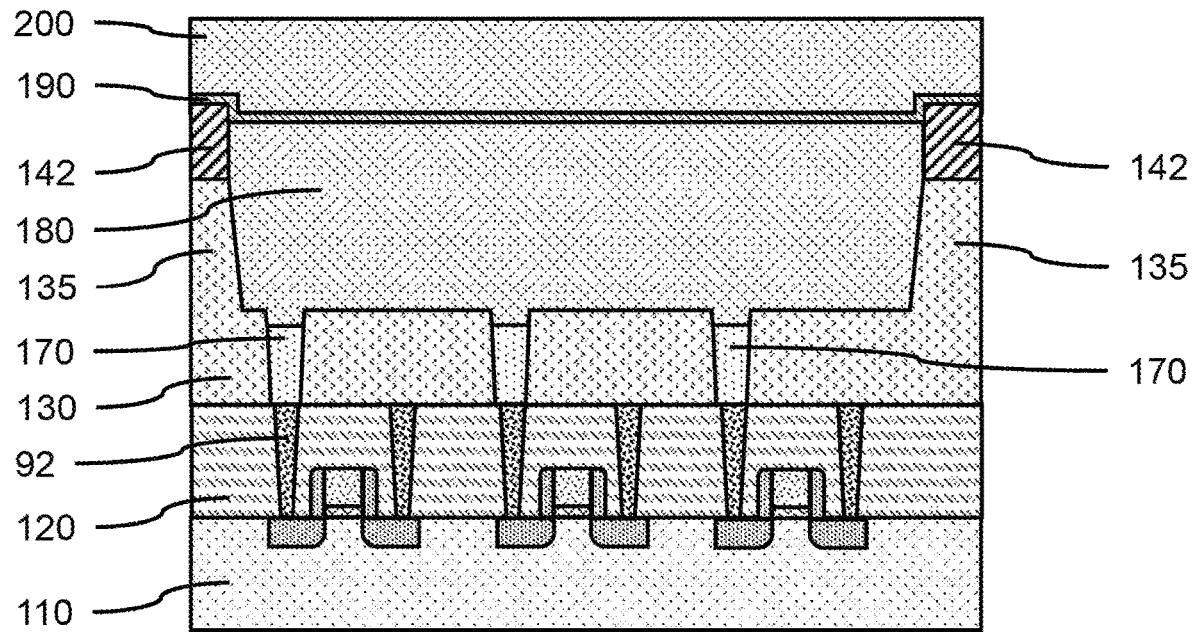
FIG. 11 is a cross-sectional side view showing a second planarization layer formed on the second capping layer, in accordance with an embodiment of the present invention.

FIG. 11 is a cross-sectional side view showing a second planarization layer formed on the second capping layer, in accordance with an embodiment of the present invention.

In one or more embodiments, a second planarization layer 200 can be formed on the second capping layer 190, where the second planarization layer 200 can be formed by a blanket deposition, for example, a spin-on process. The second planarization layer 200 can be a photo-resist material, which can be patterned and developed.

Figure 12:
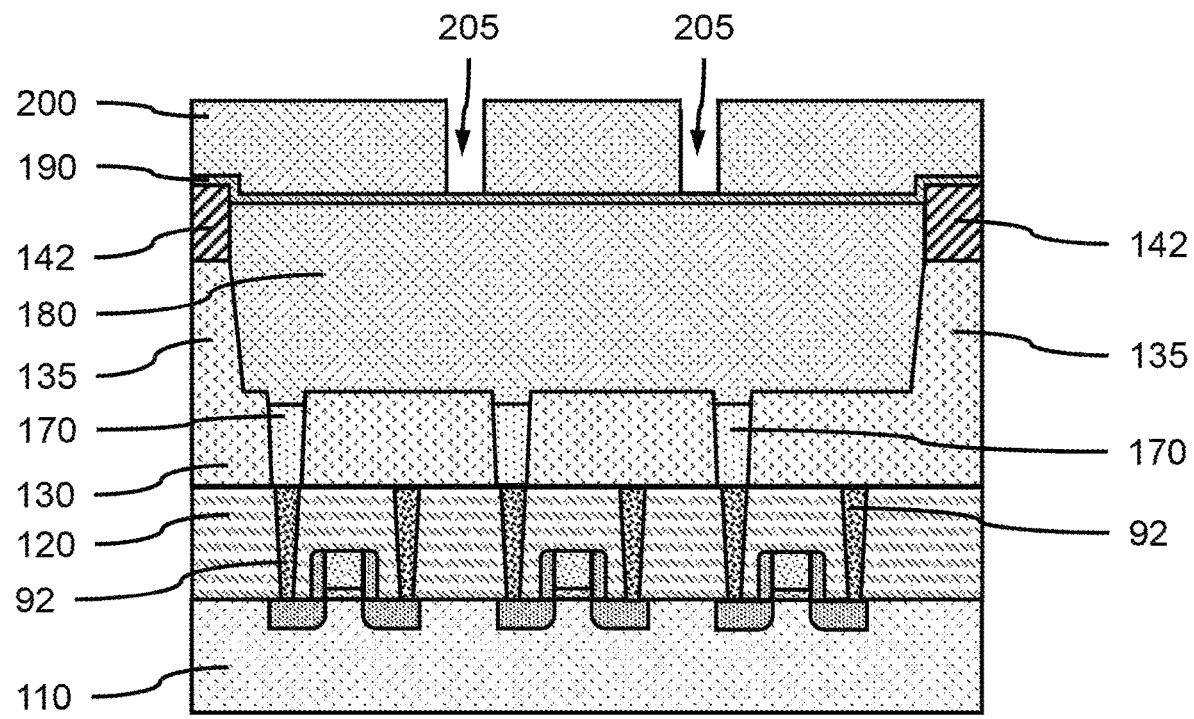
FIG. 12 is a cross-sectional side view showing planarization layer openings formed in the second planarization layer, where the openings are aligned with gaps between the sacrificial via plugs, in accordance with an embodiment of the present invention.

FIG. 12 is a cross-sectional side view showing planarization layer openings formed in the second planarization layer, where the openings are aligned with gaps between the sacrificial via plugs, in accordance with an embodiment of the present invention.

In one or more embodiments, planarization layer openings 205 can be formed in the second planarization layer 200, where the planarization layer openings 205 can be formed using lithography and developing, such as EUV patterning, where the openings can define the separation region (or "cut region") in the metal lines. The planarization layer openings 205 can be aligned with gaps between the sacrificial via plugs 170, such that openings 205 extended down to the dielectric cover layer 130 would be approximately between sacrificial via plugs 170, although there could be some misalignment.

In various embodiments, the planarization layer openings 205 can have a width in a range of about 10 nm to about 50 nm, or about 15 nm to about 30 nm, although other widths are also contemplated.

Figure 13:
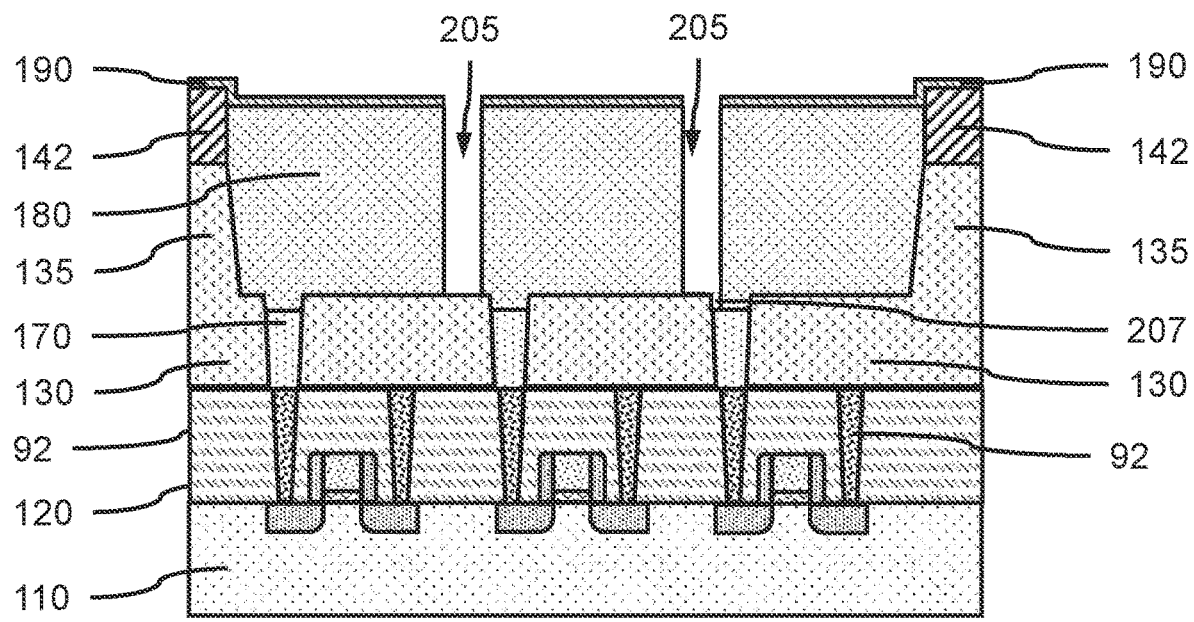
FIG. 13 is a cross-sectional side view showing the openings formed in the second planarization layer extending through the second capping layer and fill layer, in accordance with an embodiment of the present invention.

FIG. 13 is a cross-sectional side view showing the openings formed in the second planarization layer extending through the second capping layer and fill layer, in accordance with an embodiment of the present invention.

In one or more embodiments, planarization layer openings 205 can be extended through the second capping layer 190 and the fill layer 180 to the dielectric cover layer 130. The planarization layer openings 205 can be extended using selective, directional etching (e.g., RIE). Each of the planarization layer opening(s) 205 can be positioned between two adjacent sacrificial via plugs 170. A portion of the planarization layer opening 205 may overlap with a top portion of a sacrificial via plug 170, where the openings 205 would not extend beyond the top surface of sacrificial via plug 170, which can protect the via from being damaged during a metal cut process. The overlap of a planarization layer opening 205 with the step between the top surface of the dielectric cover layer 130 and the top surface of the sacrificial via plug 170 can form a divot 207 that exposes a portion of the top surface of the sacrificial via plug 170.

Figure 14:
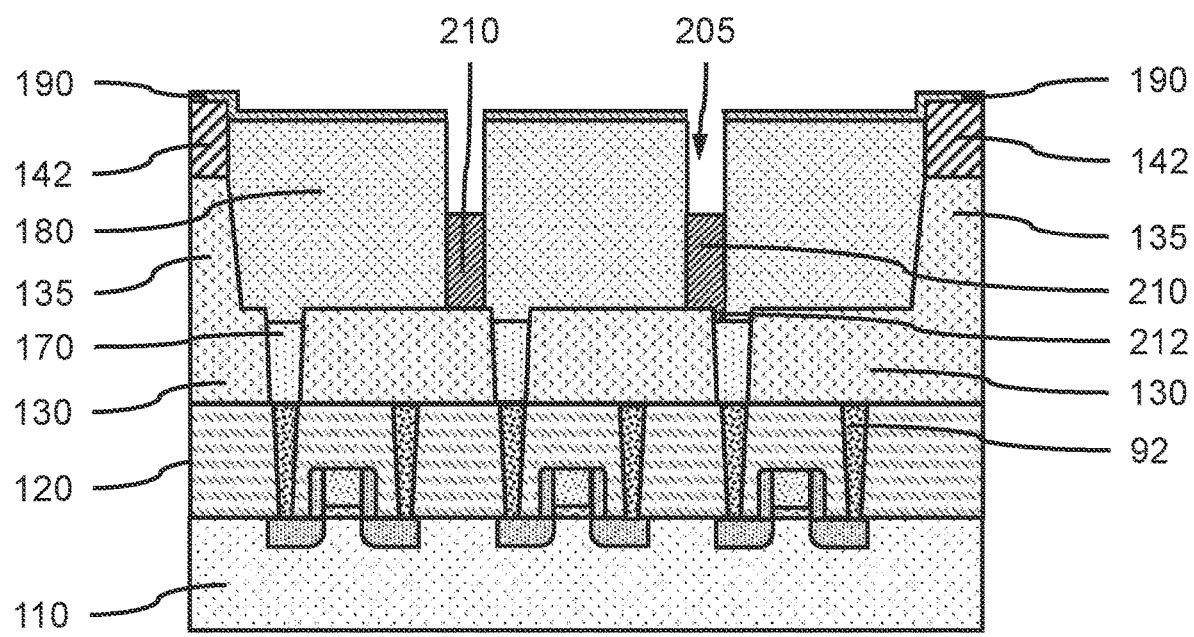
FIG. 14 is a cross-sectional side view showing a separator formed in each opening in the fill layer, in accordance with an embodiment of the present invention.

FIG. 14 is a cross-sectional side view showing a separator formed in each opening in the fill layer, in accordance with an embodiment of the present invention.

In one or more embodiments, a separator 210 can be formed in each planarization layer opening 205 in the fill layer 180. The separator(s) 210 can be formed by filling each of the planarization layer openings 205 with an insulating, dielectric material, and etching back the material to a predetermined height within planarization layer opening 205. In various embodiments the separator(s) 210 can have a height equal to or greater than a subsequently formed metal line for a metallization layer. The separator(s) 210 can fill in the divot 207 and cover the step between the dielectric cover layer 130 at the opening of the vias 155 and the top surfaces of the sacrificial via plugs 170, where a portion of the separator(s) 210 can extend below the bottom surface of the trough 133 to form a separator projection 212 in the divot 207.

In various embodiments the separator(s) 210 can be an electrically insulating, dielectric material, for example, aluminum oxide (AlO), silicon nitride (SiN), silicon oxide (SiO), silicon oxy carbonitride (SiOCN), silicon boro carbonitride (SiBCN), carbon doped silicon oxide (SiCO), silicon carbide (SiC), and combinations thereof.

In various embodiments the separator(s) 210 can have a height from the top surface of the dielectric cover layer 130 (bottom surface of the trough 133) in a range of about 15 nm to about 40 nm, although other heights are also contemplated.

Figure 15:
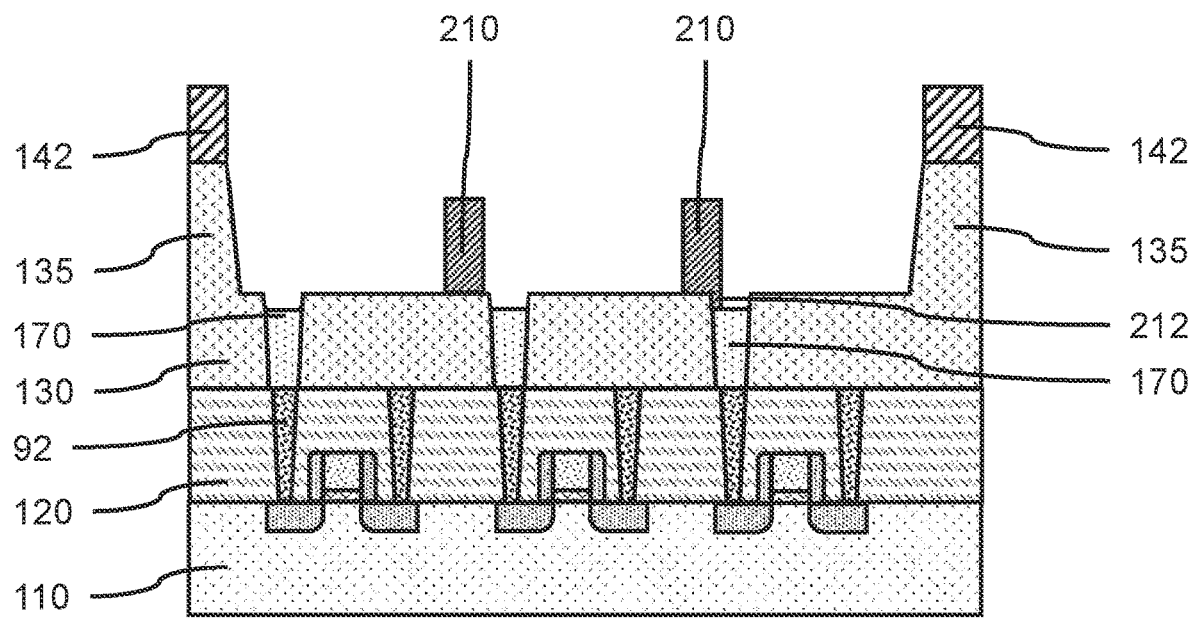
FIG. 15 is a cross-sectional side view showing the second capping layer and fill layer removed to expose the separators on the cover layer between adjacent sacrificial via plugs, in accordance with an embodiment of the present invention.

FIG. 15 is a cross-sectional side view showing the second capping layer and fill layer removed to expose the separators on the cover layer between adjacent sacrificial via plugs, in accordance with an embodiment of the present invention.

In one or more embodiments, the second capping layer 190 and fill layer 180 can be removed to expose the separators 210 on the cover layer 130 between adjacent sacrificial via plugs 170, and the separator projection(s) 212 extending below the top surface of the cover layer 130 into the upper portion of the via(s) 155. The second capping layer 190 and fill layer 180 can be removed using selective isotropic etches. Removal of the fill layer 180 can expose the sacrificial via plugs 170, where the top surfaces of the sacrificial via plugs can be below the separator projection(s) 212.

Figure 16:
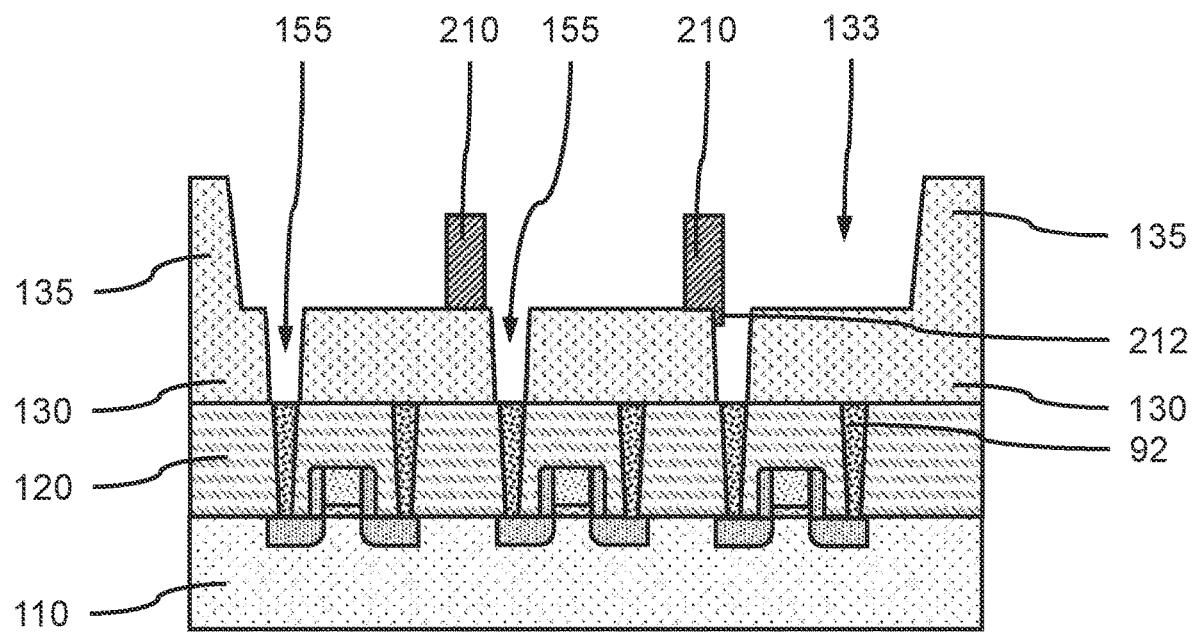
FIG. 16 is a cross-sectional side view showing the sacrificial via plugs removed, in accordance with an embodiment of the present invention.

FIG. 16 is a cross-sectional side view showing the sacrificial via plugs removed, in accordance with an embodiment of the present invention.

In one or more embodiments, the sacrificial via plugs 170 can be removed using a selective isotropic etch. Removal of the sacrificial via plugs 170 can expose the underlying electrical contacts 92. The separators 210 can remain on portions of the cover layer 130 between the reopened vias 155, where a separator projection 212 of a separator 210 may overhang a reopened via 155.

In one or more embodiments, the masking blocks 142 can be removed using a selective etch. Removal of the masking blocks 142 can expose the cover layer sidewalls 135 of the trough.

Figure 17:
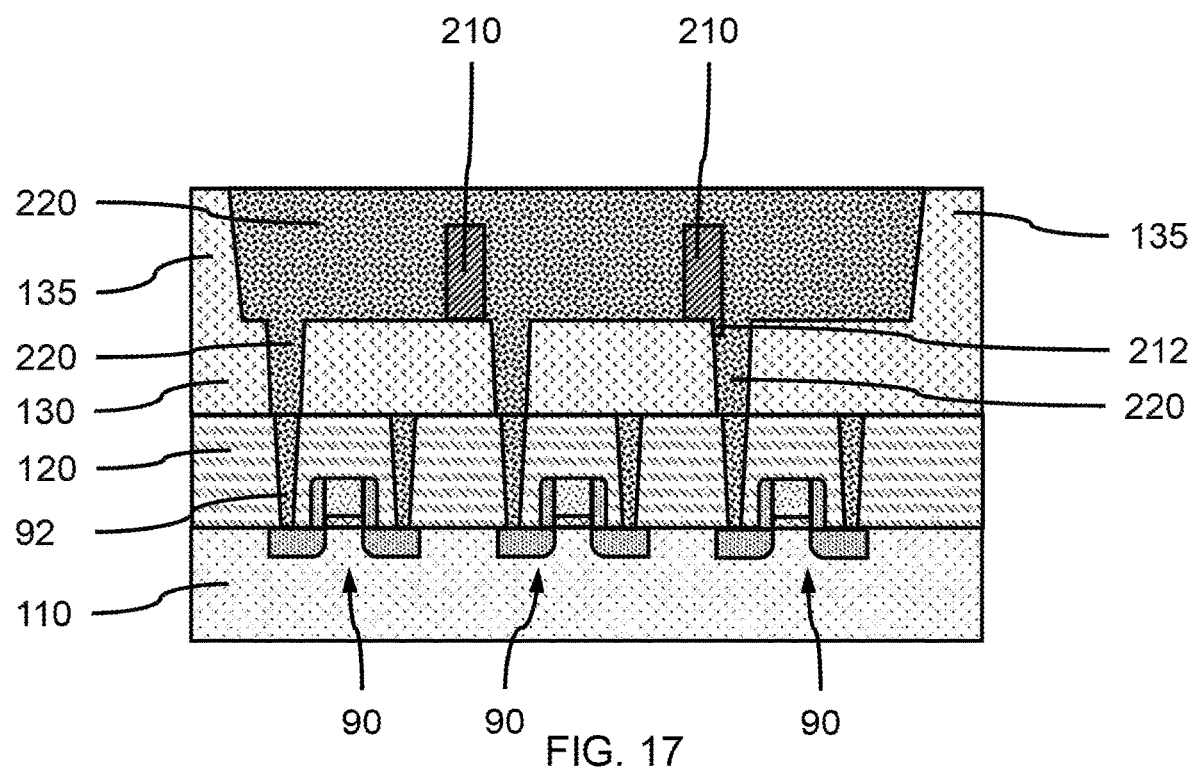
FIG. 17 is a cross-sectional side view showing a conductive layer formed in the trough and vias and over the separators, in accordance with an embodiment of the present invention.

FIG. 17 is a cross-sectional side view showing a conductive layer formed in the trough and vias and over the separators, in accordance with an embodiment of the present invention.

In one or more embodiments, a conductive layer 220 can be formed in the trough 133 and vias 155, and over the separators 210 and separator projection(s) 212, where the conductive layer 220 can be formed by a blanket deposition, for example, metal-organic chemical vapor deposition (MOCVD). A chemical-mechanical polishing (CMP) can be used to remove excess conductive layer material and leave a smooth, flat surface. The conductive layer 220 can cover the separator projection(s) 212 in the vias 155, where the conductive layer 220 can fill the reopened vias 155 even with a separator projection 212.

In various embodiments, the conductive layer 220 can be a suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotube, conductive carbon, graphene, or any suitable combination of these materials.

In a non-limiting exemplary embodiments, the conductive layer 220 can be copper (Cu) or cobalt (Co).

Figure 18:
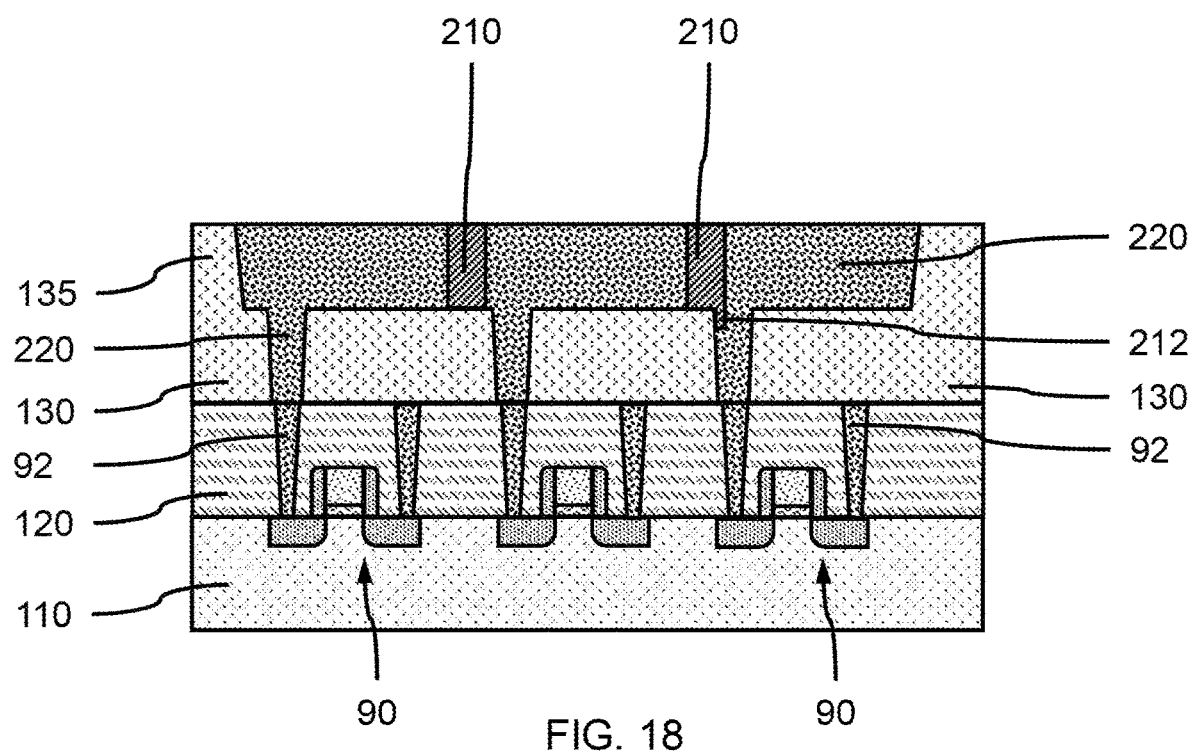
FIG. 18 is a cross-sectional side view showing a portion of the conductive layer and cover layer sidewalls removed, in accordance with an embodiment of the present invention.

FIG. 18 is a cross-sectional side view showing a portion of the conductive layer and cover layer sidewalls removed, in accordance with an embodiment of the present invention.

In one or more embodiments, a portion of the conductive layer 220 and cover layer sidewalls 135 can be removed, for example, using selective etching and/or chemical-mechanical polishing (CMP). The heights of the conductive layer 220 and cover layer sidewalls 135 can be reduced to the height of the separator(s) 210. The separators 210 can physically separate and electrically isolate the conductive layer 220 into metal lines of a first metallization layer in electrical connection with the devices 90 on the substrate 110. Since the vias 155 are reopened by removing the sacrificial via plugs 170, the size and position of the vias 155 are maintained for formation of the conductive layer 220, instead of the alignment of the planarization layer openings 205. The separator(s) 210 can separate the conductive layer 220 into electrically separated cut conductive lines, where each of the conductive lines can be electrically connected to an electrical device 90.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below" "lower," "above," "upper," and the like, can be used herein for ease of description to describe one element's or feature's relationship to another element(s) or feature(s) as illustrated in the FIGS. It understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an ion of above and below. The device can be otherwise oriented (rotated 90 degrees or at other orientations), and the spatially relative descriptors used herein can be interpreted accordingly. In addition, it will also be understood at yen a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming cut conductive lines, comprising:
   forming a sacrificial via plug in each of a plurality of vias in a dielectric cover layer;
   forming a fill layer on a top surface of the dielectric cover layer;
   forming a planarization layer opening through the fill layer, wherein the planarization layer opening is positioned between two adjacent sacrificial via plugs, and wherein a portion of the dielectric cover layer is exposed h the planarization layer opening;
   forming a separator in the planarization layer opening, wherein at least a portion of the separator is on the dielectric cover layer and the separator includes a separator projection extending below the top surface of the dielectric cover layer; and
   removing the fill layer.

2. The method of claim 1, wherein the separator is made of an electrically insulating, dielectric material.

3. The method of claim 1, wherein the sacrificial via plugs are made of a material selected from the group consisting of polycrystalline silicon, amorphous silicon, polycrystalline germanium, amorphous germanium, polycrystalline silicon-germanium, amorphous silicon-germanium, titanium oxide (TiO), aluminum oxide (AlO), and combinations thereof.

4. The method of claim 1, further comprising removing the sacrificial via plugs.

5. The method of claim 4, further comprising forming a conductive layer in the plurality of vias.

6. The method of claim 5, further comprising removing a portion of the conductive layer, so the height of the conductive layer is equal to or less than the height of the separator.

7. A method of forming cut conductive lines, comprising:
   forming a plurality of vias in a planarization layer and a dielectric cover layer, wherein each of the plurality of vias is aligned with one of a plurality of electrical contacts beneath the dielectric cover layer;
   removing the planarization layer, which opens a trough in the dielectric cover layer;
   forming a sacrificial via plug in each of the plurality of vias in the dielectric cover layer;
   forming a fill layer in the trough on a top surface of the dielectric cover layer;
   forming a planarization layer opening through the fill layer, wherein the planarization layer opening is positioned between two adjacent sacrificial via plugs;
   forming an electrically insulating separator in the planarization layer opening, wherein the separator includes a separator projection extending below the top surface of the dielectric cover layer; and
   removing the fill layer.

8. The method of claim 7, further comprising removing the sacrificial via plugs.

9. The method of claim 8, further comprising forming a conductive layer in the trough and plurality of vias.

10. The method of claim 9, further comprising removing a portion of the conductive layer, so the height of the conductive layer is equal to or less than the height of the separator.

11. The method of claim 9, wherein each of the plurality of electrical contacts is electrically connected to an electrical device.

12. The method of claim 9, wherein the electrically insulating separator is made of an electrically insulating, dielectric material selected from the group consisting of aluminum oxide (AlO), silicon nitride (SiN), silicon oxide (SiO), silicon oxy carbonitride (SiOCN), silicon bore carbonitride (SiBCN), carbon doped silicon oxide (SiCO), silicon carbide (SiC), and combinations thereof.

13. The method of claim 9, wherein the sacrificial via plugs are made of a material selected from the group consisting of polycrystalline silicon, amorphous silicon, polycrystalline germanium, amorphous germanium, polycrystalline silicon-germanium, amorphous silicon-germanium, titanium oxide MO), aluminum oxide (AlO), and combinations thereof.

14. A method of forming cut conductive lines, comprising:
- forming a trough in a dielectric cover layer over a plurality of electrical contacts;
- filling the trough with a planarization layer;
- forming a plurality of vias in the planarization layer and the dielectric cover layer, wherein each of the plurality of vias is aligned with one of the plurality of electrical contacts;
- removing the planarization layer;
- forming a sacrificial via plug in each of the plurality of vias in the dielectric cover layer;
- forming a fill layer in the trough;
- forming a planarization layer opening through the fill layer, wherein the planarization layer opening is positioned between two adjacent sacrificial via plugs; and
- forming a separator in the planarization layer opening.

15. The method of claim 14, wherein the separator is made of an electrically insulating, dielectric material.

16. The method of claim 15, wherein the separator includes a separator projection extending below the top surface of the dielectric cover layer.

17. The method of claim 14, further comprising removing the fill layer.

18. The method of claim 17, further comprising removing the sacrificial via plugs.

* * * * *